(12) United States Patent
Kim et al.

(10) Patent No.: US 10,222,838 B2
(45) Date of Patent: Mar. 5, 2019

(54) ELECTRIC SHOCK DEVICE AND PORTABLE ELECTRONIC DEVICE INCLUDING THE SAME

(71) Applicant: AMOTECH CO., LTD, Incheon (KR)

(72) Inventors: Tong Gi Kim, Yongin-si (KR); Jun-Suh Yu, Incheon (KR); Kyu Hwan Park, Yongin-si (KR); Gui Nam Sun, Incheon (KR); Jae Su Ryu, Seoul (KR); Byung Guk Lim, Incheon (KR); Rieon Kim, Incheon (KR)

(73) Assignee: AMOTECH CO., LTD., Incheon (KR)

( * ) Notice: Subject to any disclaimer, the term of this patent is extended or adjusted under 35 U.S.C. 154(b) by 121 days.

(21) Appl. No.: 14/885,483

(22) Filed: Oct. 16, 2015

(65) Prior Publication Data

US 2016/0149398 A1 May 26, 2016

(30) Foreign Application Priority Data

Nov. 20, 2014 (KR) .................. 10-2014-0162858
Feb. 6, 2015 (KR) .................. 10-2015-0018445
Jul. 1, 2015 (KR) .................. 10-2015-0094268

(51) Int. Cl.
 *H02H 9/02* (2006.01)
 *G06F 1/16* (2006.01)
 (Continued)

(52) U.S. Cl.
 CPC .......... *G06F 1/1656* (2013.01); *G06F 1/1626* (2013.01); *H01L 27/0288* (2013.01); *H02H 9/046* (2013.01); *H05K 1/0257* (2013.01)

(58) Field of Classification Search
 CPC ........ H02H 9/02; H02H 9/046; G06F 1/1626; G06F 1/1656; H05K 1/0257; H01L 27/0288

(Continued)

(56) References Cited

U.S. PATENT DOCUMENTS 4,214,211 A * 7/1980 Yokogawa ................ H01T 4/08
455/287
2001/0011766 A1 8/2001 Nishizawa et al.
(Continued)

FOREIGN PATENT DOCUMENTS

CN 2010063677 Y 5/2008
CN 102017339 A 4/2011
(Continued)

OTHER PUBLICATIONS

Communication pursuant to Rule 164(1) EPC, dated Jun. 19, 2017, for European Application No. 15831205.8-1972 / 3062321, 14 pages.

(Continued)

*Primary Examiner* — Thienvu Tran
*Assistant Examiner* — Kevin J Comber
(74) *Attorney, Agent, or Firm* — Seed IP Law Group LLP

(57) ABSTRACT

Provided is an electric shock protection device disposed between a human body contactable conductor and an internal circuit unit of an electronic device, wherein in order to pass static electricity without causing dielectric breakdown when the static electricity flows from the conductor, block a leakage current of an external power source flowing from a ground of the circuit unit, and pass communication signals flowing from the conductor, the following equation is satisfied:

$$Vbr > Vin$$

where Vbr is a breakdown voltage of the electric shock protection device and Vin is a rated voltage of an external power source of the electronic device.

23 Claims, 13 Drawing Sheets

(51) Int. Cl.
*H02H 9/04* (2006.01)
*H05K 1/02* (2006.01)
*H01L 27/02* (2006.01)

(58) Field of Classification Search
USPC .......................................................... 361/56
See application file for complete search history.

(56) References Cited

U.S. PATENT DOCUMENTS

| | | | | |
|---|---|---|---|---|
| 2005/0276001 | A1* | 12/2005 | Matsuoka | H01C 7/1006 361/306.3 |
| 2009/0103260 | A1* | 4/2009 | Tomioka | G06F 1/1626 361/679.56 |
| 2011/0038088 | A1* | 2/2011 | Noma | H01T 4/08 361/112 |
| 2012/0300355 | A1* | 11/2012 | Umeda | H05K 9/0067 361/220 |
| 2013/0279064 | A1 | 10/2013 | Otsubo | |
| 2014/0146425 | A1 | 5/2014 | Kim et al. | |

FOREIGN PATENT DOCUMENTS

| | | |
|---|---|---|
| CN | 103270656 A | 8/2013 |
| JP | 61-33625 Y2 | 10/1986 |
| JP | 62-10981 Y2 | 3/1987 |
| JP | 63-23911 A | 2/1988 |
| JP | 63-188905 A | 8/1988 |
| JP | 10-199709 A | 7/1998 |
| JP | 2003-257781 A | 9/2003 |
| JP | 2005505188 A | 2/2005 |
| JP | 2010-146779 A | 7/2010 |
| KR | 100573364 B1 | 4/2006 |
| KR | 100630187 B1 | 9/2006 |
| KR | 10-0713532 B1 | 4/2007 |
| KR | 100713532 B1 | 4/2007 |
| KR | 10-2007-0103870 A | 10/2007 |
| KR | 10-0813195 B1 | 3/2008 |
| KR | 10-2008-0044551 A | 5/2008 |
| KR | 10-2008-0067917 A | 7/2008 |
| KR | 10-0845948 B1 | 7/2008 |
| KR | 10-2009-0126585 A | 12/2009 |
| KR | 10-2010-0019981 A | 2/2010 |
| KR | 1020100019981 A | 2/2010 |
| KR | 10-2010-0139075 A | 12/2010 |
| KR | 1020100139075 A | 12/2010 |
| KR | 10-1012965 B1 | 2/2011 |
| KR | 10-2012-0120279 A | 11/2012 |
| KR | 10-2012-0132365 A | 12/2012 |
| KR | 10-2013-0026918 A | 3/2013 |

OTHER PUBLICATIONS

International Search Report, dated Nov. 13, 2015, for International Application No. PCT/KR2015/007121, 3 pages.
International Search Report, dated Nov. 13, 2015, for International Application No. PCT/KR2015/007122, 3 pages.
Office Action, dated May 17, 2017, for Chinese Application No. 20150599606.6, 10 pages. (with English Translation).
Office Action, dated Aug. 25, 2017, for Chinese Application No. 201510794419.3, 13 pages. (with English Translation).
Office Action, dated Jul. 31, 2017, for Japanese Application No. 2016-534238, 5 pages.
Office Action, dated Jun. 15, 2017, for Korean Application No. 10-2016-0035372, 5 pages.
Office Action, dated May 28, 2018, for Korean Application No. 10-2016-0035372, 6 pages.
Office Action, dated Sep. 17, 2015, for Korean Application No. 10-2015-0094268, 7 pages.

* cited by examiner

ELECTRIC SHOCK DEVICE AND PORTABLE ELECTRONIC DEVICE INCLUDING THE SAME

CROSS-REFERENCE TO RELATED APPLICATIONS

The entire contents of Korean Patent Application Nos. 10-2014-0162858, filed on Nov. 20, 2014, 10-2015-0018445, filed on Feb. 6, 2015, and 10-2015-0094268, filed on Jul. 1, 2015, are hereby incorporated by reference.

BACKGROUND OF THE INVENTION

The present invention disclosed herein relates to an electric shock protection device and a portable electronic device including the same, and more particularly, to an electric shock protection device for protecting a user from leakage current due to power, protecting an internal circuit from external electrostatic, and minimizing the attenuation of communication signals and delivering them, and a portable electronic device including the same.

Recent portable electronic devices employ housings of a metal material increasingly in order to improve the aesthetics and durability.

However, since such housings of a metal material have excellent electrical conductivity due to characteristics of a material, an electrical path may be formed between an external housing and a built-in circuit unit through a specific device or according to a portion. Especially, as a metal housing and a circuit unit forms a loop, when static electricity of a momentarily high voltage flows through a conductor such as a metal housing with a large external exposure area, this may damage a circuit unit such as IC and therefore, measures against this may be required.

On the other hand, such a portable electronic device typically charges its battery by using a charger. Such a charger rectifies external AC power into DC power and then again converts it into low DC power appropriate for a portable electronic device through a transformer. Herein, a Y-CAP configured with a capacitor is provided to both ends of a transformer in order to enhance the electrical insulation of the transformer.

However, if Y-CAP does not have a regular characteristic such as a non-genuine charger, DC power may not be sufficiently block by Y-CAP and furthermore, leakage current may occur by AC power. Additionally, such leakage current may be spread along the ground part of circuit.

Since such leakage current can be delivered to a human body contactable conductor such as an external case of a portable electronic device, this may provide discomfort painful feeling to a user and in severe cases, a user may get fatal injuries due to electric shock.

Accordingly, a portable electronic device such as a mobile phone employing a metal case may require an effective plan to protect a user from such leakage current.

Moreover, in such a way, a portable electronic device including a housing of a metal material includes a plurality of antennas by each function according to the multi-functionalization. At least part of antennas may be disposed at an external housing of a portable electronic device as a built-in antenna or a metal housing itself may be used as an antenna.

In such a case, an antenna and an internal circuit of a portable electronic device are required to be connected to each other and at this point, communication signals are required to be smoothly delivered to the internal circuit without attenuation.

However, as mentioned above, if a capacitance of a corresponding device is increased to effectively deliver communication signals, dielectric breakdown may be caused by external static electricity and accordingly, a corresponding device may be damaged.

Furthermore, as mentioned above, the implementation of a high breakdown voltage for blocking leakage current by external power and the implementation of a high-capacity capacitance for delivering communication signals may not be achieved due to their opposite effects. Accordingly, a scheme for protecting a user from static electricity, blocking leakage current, and implementing a high capacitance is required.

SUMMARY OF THE INVENTION

An object of the present invention is to provide an electric shock protection device for protecting an internal circuit and/or a user from leakage current due to static electricity or external power and minimizing the attenuation of communication signal to deliver it and a portable electronic device including the same.

According to an embodiment of the present invention, there is provided an electric shock protection device disposed between a human body contactable conductor and an internal circuit unit of an electronic device, wherein in order to pass static electricity without causing dielectric breakdown when the static electricity flows from the conductor, block a leakage current of an external power source flowing from a ground of the circuit unit, and pass communication signals flowing from the conductor, the following equation is satisfied:

$$V_{br} > V_{in}$$

where Vbr is a breakdown voltage of the electric shock protection device and Vin is a rated voltage of an external power source of the electronic device.

The rated voltage may be a country-specific standard rated voltage.

$V_{cp} > V_{br}$ where Vcp is a dielectric breakdown voltage of a capacitor layer.

The communication signals may have a wireless communication frequency band.

The electric shock protection device includes: a sintered body where a plurality of sheet layers stacked; an electric shock protection unit including at least one pair of inner electrodes spaced a predetermined interval apart from each other inside the sintered body and a pore disposed between the inner electrodes; and at least one capacitor layer configured to pass communication signals flowing from the conductor.

The pair of inner electrodes may be disposed on the same plane.

The pore may have an inner wall to which a discharging material layer is applied at a predetermined thickness along a height direction.

The pore may be provided in plurality between the pair of inner electrodes.

The discharging material layer may be formed of a non-conductive material including metal particles or a semiconductor material.

The discharging material may include a first portion applied along the inner wall of the pore, a second portion outwardly extending from an upper end of the first portion, and a third portion outwardly extending from a lower end of the first portion; and the second portion may contact one of the pair of inner electrodes and the third portion may contact the other one of the pair of inner electrodes.

The sintered body may be formed of an insulator having permittivity.

The inner electrode may include at least one component of Ag, Au, Pt, Pd, Ni, and Cu.

The capacitor layer may be electrically connected in parallel to the electric shock protection unit.

An interval between the capacitor layer and the electric shock protection unit may be greater than an interval between the pair of inner electrodes of the electric shock protection unit.

The electric shock protection device may include: an electric shock protection unit including at least two varistor material layers where a first varistor material layer and a second varistor material layer are stacked alternately, a plurality of first inner electrodes spaced a predetermined interval apart from each other on the first varistor material layer, and a plurality of second inner electrodes spaced a predetermined interval apart from each other on the second varistor material layer; and at least one capacitor layer configured to pass communication signals flowing from the conductor.

The breakdown voltage may be a sum of each unit breakdown voltage formed between the most adjacent first inner electrode and second inner electrode.

At least portion of each of the first inner electrode and the second inner electrode may be disposed to overlap each other.

Each of the first inner electrode and the second inner electrode may be disposed not to overlap each other.

A spaced interval between the first inner electrodes or the second inner electrodes may be greater than a sum of the shortest distance between the first inner electrode and the second inner electrode and the shortest distance between the other adjacent first inner electrode and the second inner electrode.

The first varistor material layer and the second varistor material layer may be formed of a semiconductor material including at least one of $ZnO$, $SrTiO_3$, $BaTiO_3$, and $SiC$ or any one of a Pr and Bi based material.

The capacitor layer may be electrically connected in parallel to the electric shock protection unit.

A distance between the capacitor layer and the electric shock protection unit may be greater than a sum of the shortest distance between the first inner electrode and the second inner electrode and the shortest distance between the other adjacent first inner electrode and the second inner electrode.

The capacitor layer may include a plurality of sheet layers and is formed a ceramic material.

According to an embodiment of the present invention, there is provided a portable electronic device with an electric shock protection function. The portable electronic device includes: a human body contactable conductor; a circuit unit; and an electric shock protection device disposed between the conductor and the circuit unit, wherein the electric shock protection device satisfies the following equation in order to pass static electricity without causing dielectric breakdown when the static electricity flows from the conductor, block a leakage current of an external power source flowing from a ground of the circuit unit, and pass communication signals flowing from the conductor, $$Vbr>Vin \text{ and } Vcp>Vbr$$

where Vbr is a breakdown voltage of the electric shock protection device and Vin is a rated voltage of an external power source of the electronic device and Vcp is a dielectric breakdown voltage of the capacitor layer.

The conductor may include at least one of an antenna for communication between the electronic device and an external device, a metal case, and a conductive jewelry.

The metal case may be provided to partially or entirely surround a side part of a housing of the electronic device.

The metal case may be provided to surround a camera that is provided at a front or rear surface of a housing of the electronic device to be exposed to the outside.

According to an embodiment of the present invention, there is provided an electric shock protection device disposed between a human body contactable conductor and an internal circuit unit of an electronic device, the electric shock protection device includes: an electric shock protection unit configured to pass static electricity without causing dielectric breakdown when the static electricity flows from the conductor and also block a leakage current of an external power source flowing from a ground of the circuit unit; and a capacitor unit connected in parallel to the electric shock protection unit to pass communication signal flowing from the conductor without attenuation, wherein the electric shock protection unit satisfies the following equation:

$$Vbr>Vin \text{ and } Vcp>Vbr$$

where Vbr is a breakdown voltage of the electric shock protection unit and Vin is a rated voltage of an external power source of the electronic device and Vcp is a dielectric breakdown voltage of the capacitor unit.

The electric shock protection unit may include: a sintered body where a plurality of sheet layers stacked; at least one pair of inner electrodes spaced a predetermined interval apart from each other in the sintered body; and a pore disposed between the inner electrodes.

The electric shock protection unit may include at least two varistor material layers where a first varistor material layer and a second varistor material layer are stacked alternately, a plurality of first inner electrodes spaced a predetermined interval apart from each other on the first varistor material layer, and a plurality of second inner electrodes spaced a predetermined interval apart from each other on the second varistor material layer.

The capacitor unit may include at least one capacitor layer disposed at one of a top and bottom of the electric shock protection unit or disposed at both the top and bottom of the electric shock protection unit, being spaced a predetermined interval apart from each other.

BRIEF DESCRIPTION OF THE DRAWINGS

The accompanying drawings are included to provide a further understanding of the present invention, and are incorporated in and constitute a part of this specification. The drawings illustrate exemplary embodiments of the present invention and, together with the description, serve to explain principles of the present invention. In the drawings.

DETAILED DESCRIPTION OF PREFERRED EMBODIMENTS

Figure 1:
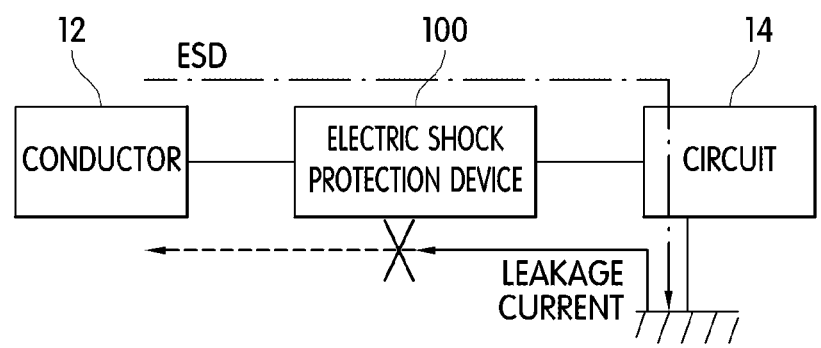
FIG. 1 is a schematic diagram of an electric shock protection device according to an embodiment of the present invention.

Preferred embodiments of the present invention will be described below in more detail with reference to the accompanying drawings. The present invention may, however, be embodied in different forms and should not be constructed as limited to the embodiments set forth herein. Parts not relating to description are omitted in the drawings in order to clearly describe the present invention and like reference numerals refer to like elements throughout.

An electric shock protection device 100 according to an embodiment of the present invention, as shown in FIG. 1, may be disposed between a human body contactable conductor 12 and an internal circuit unit 14 of an electronic device.

The electric shock protection device 100 may have a breakdown voltage Vb satisfying the following equation in order to pass static electricity without causing dielectric breakdown when the static electricity flows from the conductor 12, block a leakage current of an external power source flowing from the ground of the circuit unit 14, and pass communication signals flowing from the conductor 12:

$$Vbr > Vin, Vcp > Vbr$$

where Vin is a rated voltage of an external power source of the electronic device and Vcp is a dielectric breakdown voltage of the capacitor layer.

At this point, the rated voltage may be country-specific standard rated voltage, and for example, may be one of 240V, 110V, 220V, 120V, and 100V.

The electric shock protection device 100 may be a varistor with a capacitor layer or a suppressor with a capacitor layer. At this point, the breakdown voltage Vbr means a breakdown voltage (or a trigger voltage) of a varistor or a suppressor. An interval between inner electrodes of a varistor or a suppressor, an overlapping area of an inner electrode, a permittivity of a stacked sheet layer, a pore volume between inner electrodes, and a particle size of a discharging material layer and varistor material may be determined according to the number of inner electrodes connected in series.

Figure 2A:
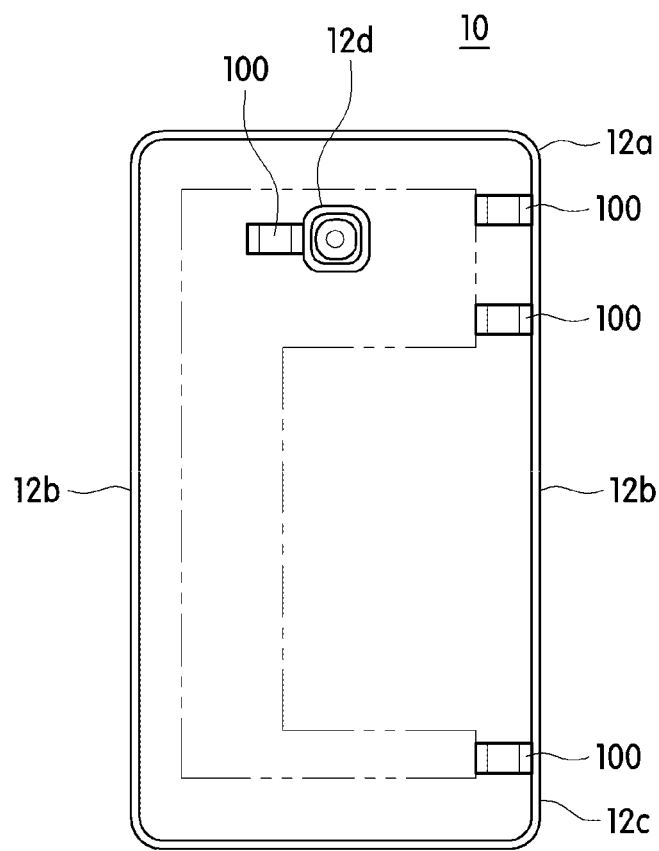
FIGS. 2A to 2E are conceptual diagrams illustrating an application example of an electric shock protection device according to an embodiment of the present invention.

The electric shock protection device 100, as shown in FIG. 2A, may be disposed between the conductor 12 such as an external metal case and the circuit unit 14 in the portable electronic device 10.

Herein, the portable electronic device 10 may be in a form of a portable and easy to carry electronic device. As one example, the portable electronic device may be a portable terminal such as smartphones and cellular phones and may be smart watches, digital cameras, DMB, e-books, netbooks, tablet PCs, and portable computers. Such electronic devices may include any suitable electronic components including antenna structures for communication with an external device. Furthermore, such electronic devices may be devices using short range network communications such as WiFi and Bluetooth.

The portable electronic device 10 may include an external housing formed of conductive materials such as metals (for example, aluminum, stainless steel, etc.), or carbon-fiber composite materials, or materials including other fiber-based composites, glass, ceramic, plastic or combinations thereof.

At this point, the housing of the portable electronic device 10 is formed of metal and include a conductor 12 exposed to the outside. Herein, the conductor 12 may include at least one of antennas, metal cases, and conductive jewelries for communication between the electronic device and an external device.

Especially, the metal case may be provided to partially or entirely surround a side part of the housing of the portable electronic device 10. Additionally, the metal case may be provided to partially or entirely surround a side part of the housing of the portable electronic device 10.

In such a way, the electric shock protection device 100 may be disposed between the human contactable conductor 12 and the circuit unit 14 of the portable electronic device 10 in order to protect an internal circuit from leakage current and static electricity.

The electric shock protection device 100 may be provided in correspondence to the number of metal cases equipped at the housing of the portable electronic device 10. However, when the metal case is provided in plurality, each of the metal cases 12a, 12b, 12c, and 12d may be built in the housing of the portable electronic device 10 to allow the electric shock protection device 100 to be individually connected thereto.

That is, as shown in FIG. 2A, when the conductor 12 such as a metal case surrounding a side part of the housing of the portable electronic device 10 is divided into three parts, as each of the metal cases 12a, 12b, 12c, and 12d is connected to the electric shock protection device 100, the internal circuit of the portable electronic device 100 may be protected from leakage current and static electricity.

At this point, when the plurality of metal cases 12a, 12b, 12c, and 12d are provided, the electric shock protection device 100 may be provided in various methods to suit a corresponding role of each of the metal cases 12a, 12b, 12c, and 12d.

As one example, in a case that a camera exposed to the outside is provided to the housing of the portable electronic device 10, if the electric shock protection device 10 is applied to a conductor 12d surrounding the camera, the electric shock protection device 100 may be provided in a form of blocking leakage current and protecting an internal circuit from static electricity.

Additionally, when the metal case 12b serves as a ground role, the electric shock protection device 100 is connected to the metal case 12*b* to be provided in a form of blocking leakage current and protecting an internal circuit from static electricity.

Figure 2B:
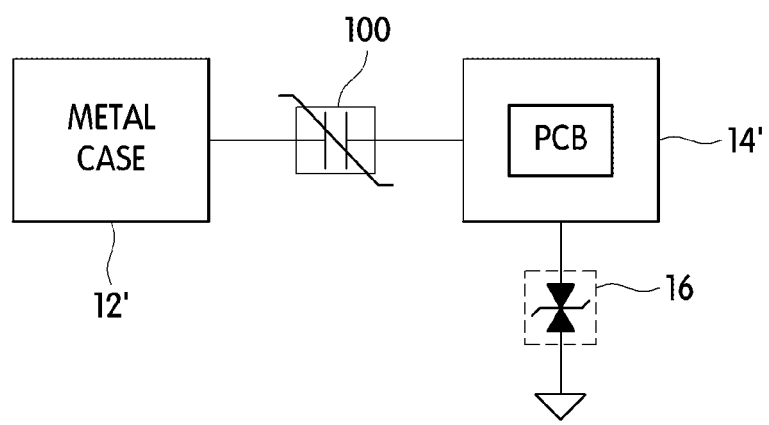

Moreover, as shown in FIG. 2B, the electric shock protection device 100 may be disposed between a metal case 12' and a circuit substrate 14'. At this point, since the electric shock protection device 100 is for passing static electricity without damage to itself, the circuit substrate 14' may include an additional protection device 16 for bypassing static electricity to the ground. Herein, the protection device 16 may be a suppressor or a varistor.

Figure 2C:
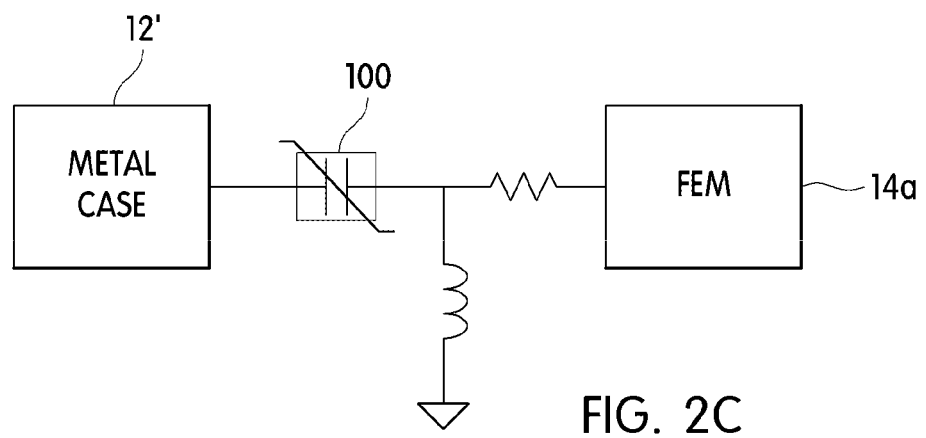

As shown in FIG. 2C, the electric shock protection device 100 may be disposed through a matching circuit (for example, R and L components) between a metal case 12' and a Front End Module (FEM) 14*a*. Herein, the metal case 12' may be an antenna. At this point, the electric shock protection device 100 passes static electricity from the metal case 12' at the same time when passing communication signals without attenuation and blocks a leakage current flowing from the ground through a matching circuit.

Figure 2D:
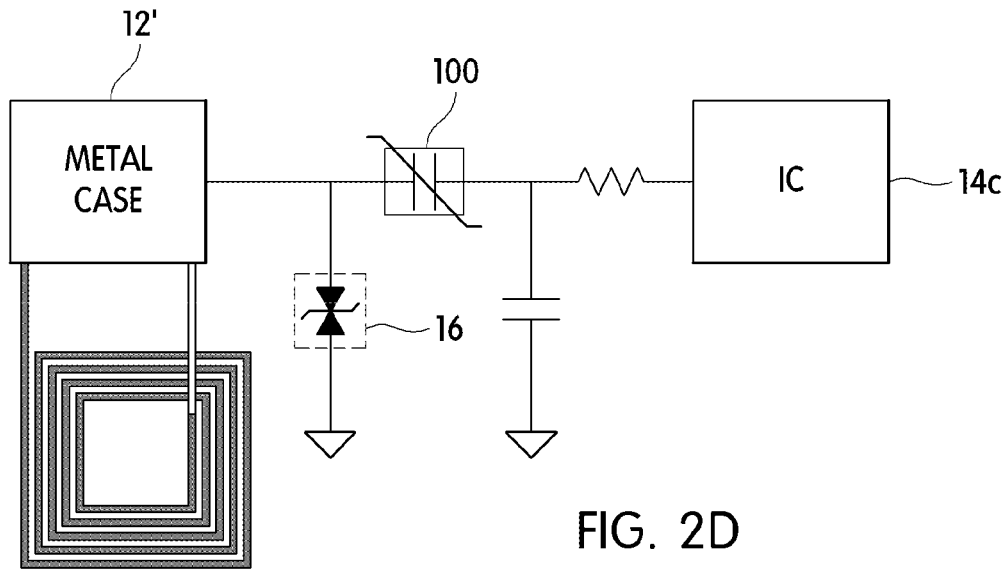

As shown in FIG. 2D, the electric shock protection device 100 may be disposed between the metal case 12' including an antenna and an IC 14*c* for implementing a communication function through a corresponding antenna. Herein, a corresponding communication function may be NFC communication. At this point, since the electric shock protection device 100 is for passing static electricity without damage to itself, it may include an additional protection device 16 for bypassing static electricity to the ground. Herein, the protection device 16 may be a suppressor or a varistor.

Figure 2E:
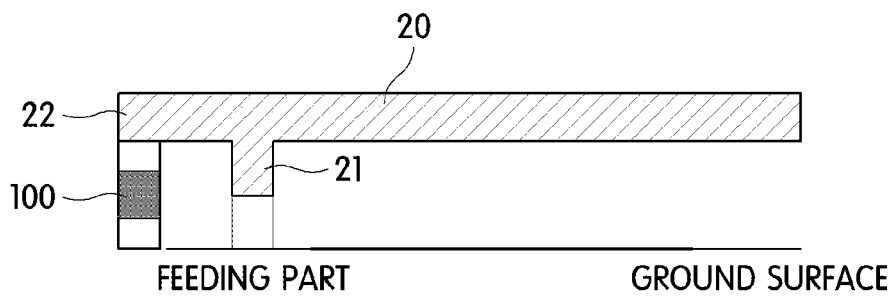

As shown in FIG. 2E, the electric shock protection device 100 may be disposed between a short pin 22 of a Planar Inverted F Antenna (FIFA) and a matching circuit. At this point, the electric shock protection device 100 passes static electricity from the metal case 12' at the same time when passing communication signals without attenuation and blocks a leakage current flowing from the ground through a matching circuit.

Figure 3A:
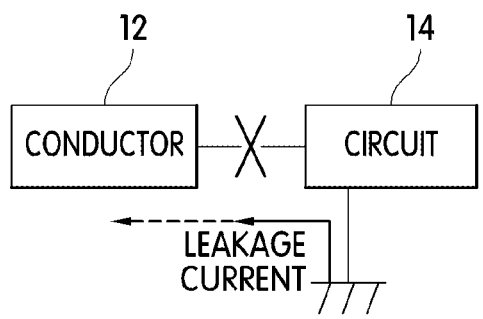
FIG. 3A is schematic equivalent circuit diagrams illustrating operations for leakage current of an electric shock protection device according to an embodiment of the present invention.
Figure 3B:
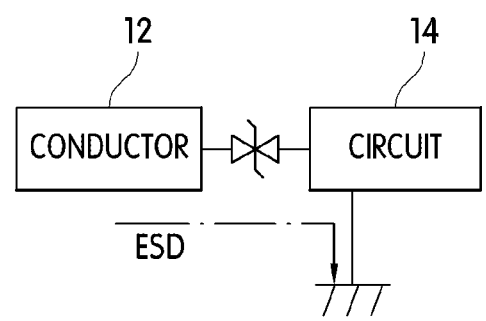
FIG. 3B is schematic equivalent circuit diagrams illustrating operations for electrostatic discharge (ESD) of an electric shock protection device according to an embodiment of the present invention.
Figure 3C:
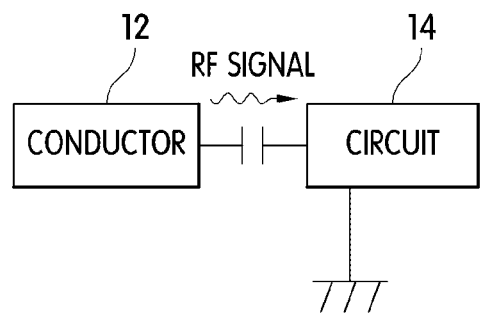
FIG. 3C is schematic equivalent circuit diagrams illustrating operations for communication signals of an electric shock protection device according to an embodiment of the present invention.

The electric shock protection device 100, as shown in FIGS. 3A to 3C, may have different functions according to leakage current by external power source and static electricity flowing from the conductor 12, and communication signals.

That is, as shown in FIG. 3A, when a leakage current of external power source flows into the conductor 12 through a circuit substrate of the circuit unit 14 (for example, the ground), since the breakdown voltage Vbr of the electric shock protection device 100 is high in comparison to overvoltage by leakage current, the electric shock protection device 100 may be maintained in an open state. That is, since the breakdown voltage Vbr of the electric shock protection device 100 is higher than the rated voltage of an external power source of a portable electronic device, the electric shock protection device 100 is not electrically conducted and maintains an open state so that delivering leakage current to the human body contactable conductor 12 such as a metal case can be prevented.

At this point, a capacitor layer included in the electric shock protection device 100 may block a DC component in leakage current and since the leakage current has a relatively low frequency in comparison to a wireless communication band, it serves as a large impedance with respect to a corresponding frequency so that the leakage current can be blocked.

As a result, the electric shock protection device 100 blocks leakage current in an external power source flowing from the ground of the circuit unit 14, so that a user can be protected from electric shock.

Figure 5A:
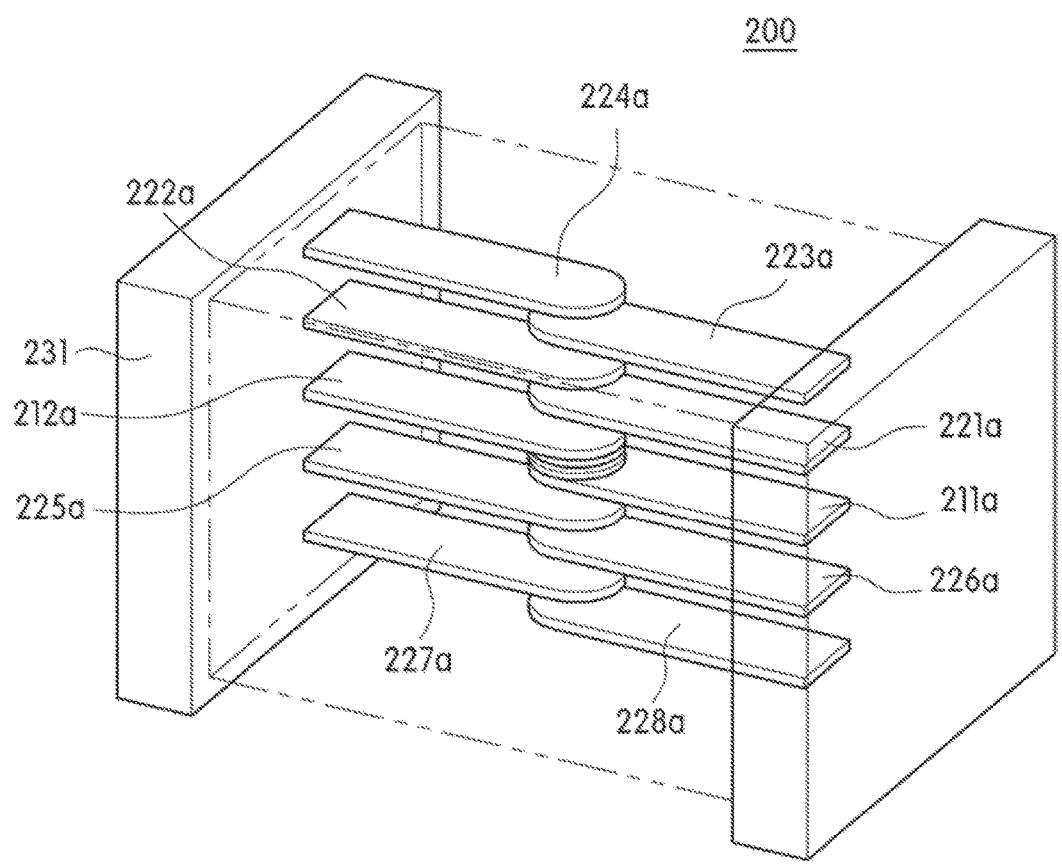
FIGS. 5A to 5C are views illustrating an electric shock protection device according to an embodiment of the present invention.
Figure 5B:
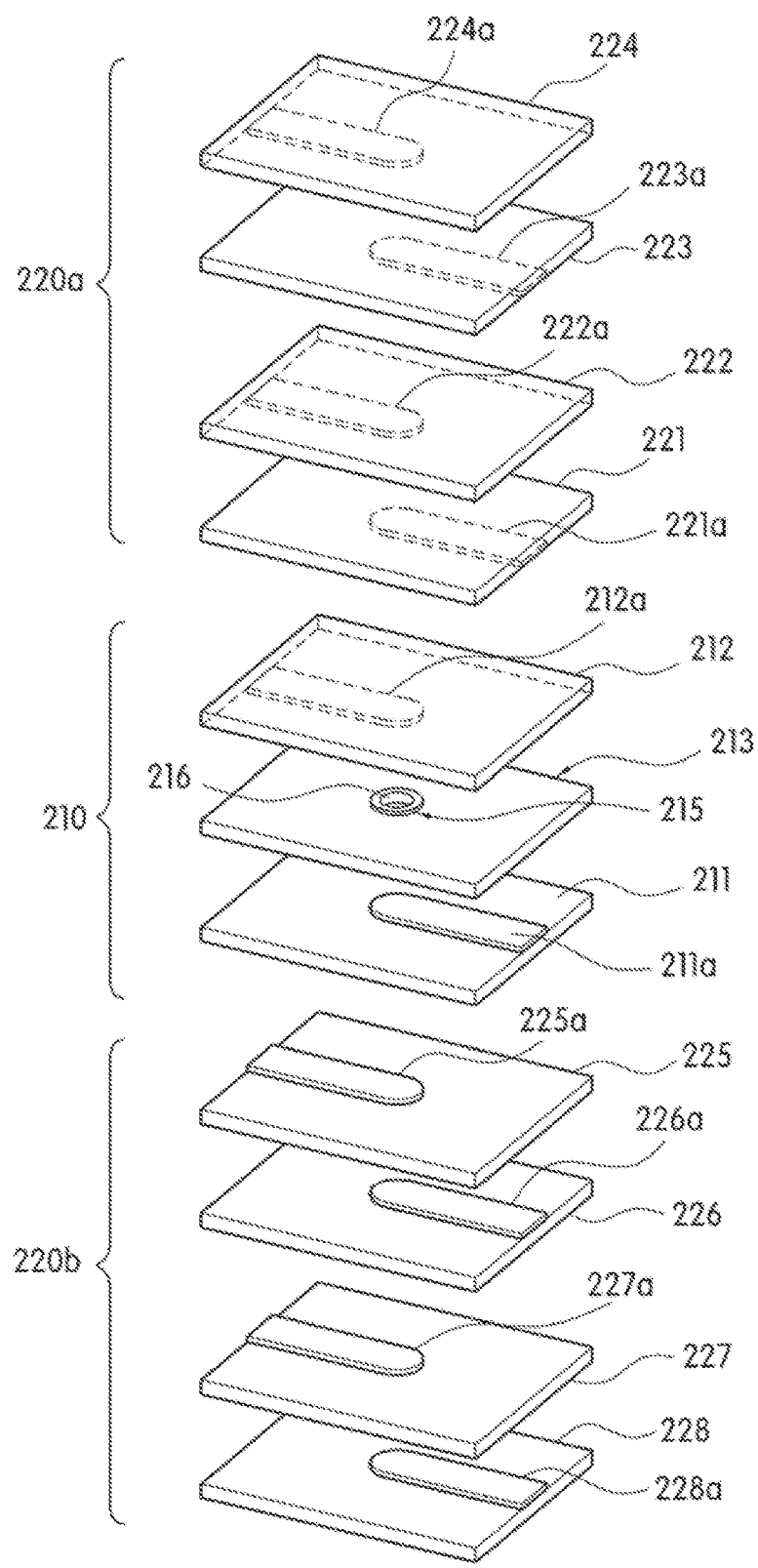

Additionally, as shown in FIG. 5B, when static electricity flows from the outside through the conductor 12, the electric shock protection device 100 may serve as a static electricity protection device such as a suppressor or a varistor. That is, when the electric shock protection device 100 is a varistor, since the breakdown voltage Vbr of the varistor is less than an instantaneous voltage of static electricity, it may be electrically conducted to pass the static electricity and when the electric shock protection device 100 is a suppressor, since an operating voltage of the suppressor for static electricity discharge is less than an instantaneous voltage of static electricity discharge, it may pass the static electricity by instantaneous discharge. As a result, since electrical resistance becomes lower when static electricity flows from the conductor 12, the electric shock protection device 100 itself does not cause dielectric breakdown and passes static electricity.

At this point, in relation to a capacitor layer included in the electric shock protection device 100, since the dielectric breakdown voltage Vcp is higher than the breakdown voltage Vbr of a varistor or a suppressor, static electricity does not flow into the capacitor layers 220*a* and 220*b* and is passed to only the varistor or the suppressor.

Herein, the circuit unit 14 may include an additional protection device for bypassing static electricity to the ground. As a result, the electric shock protection device 100 does not cause dielectric breakdown by a static electricity flowing from the conductor 12 and passes static electricity so that it can protect an internal circuit at the rear end.

Additionally, as shown in FIG. 3C, when communication signals flow through the conductor 12, the electric shock protection device 100 may serve as a capacitor. That is, the electric shock protection device 100 may block the conductor 12 and the circuit unit 14 as a suppressor or a varistor is maintained in an open state, but an internal capacitor layer may pass the flowing communication signals. In such a way, a capacitor layer of the electric shock protection device 100 may provide a flowing path of communication signals.

Figure 4A:
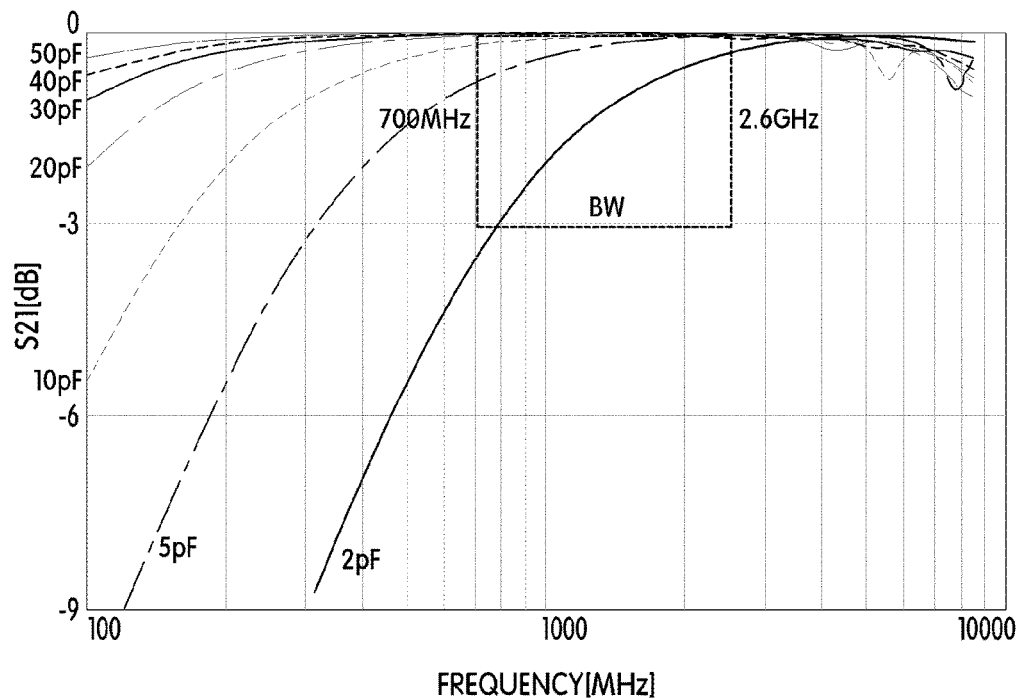
FIGS. 4A and 4B are graphs illustrating a simulation result for pass frequency band according to capacitance.
Figure 4B:
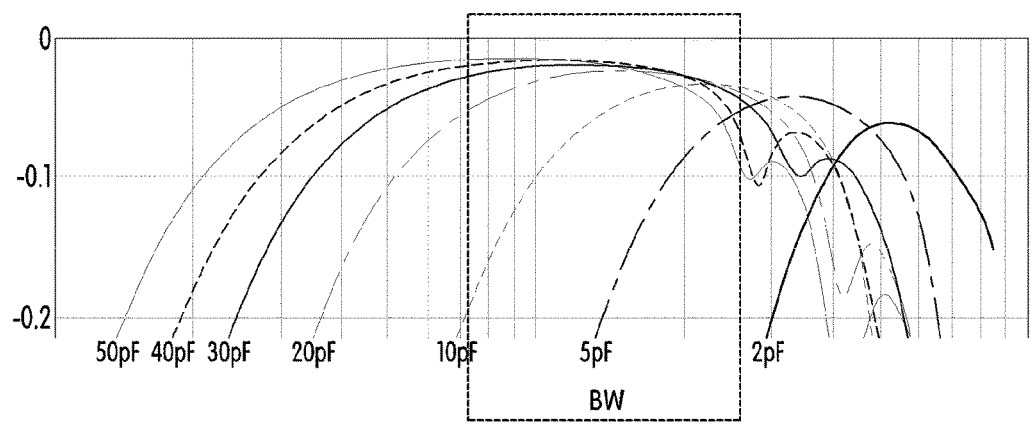

Herein, the capacitance of a capacitor layers may be set to pass communication signals in an important wireless communication band without attenuation. As shown in FIGS. 4A and 4B, according to a result obtained by simulating a pass frequency band depending on a capacitance, with respect to a capacitance of more than 5 pF, signals are delivered substantially with little loss in a mobile wireless communication frequency band (for example, 700 MHz to 2.6 GHz) so that it represents an electrical short phenomenon.

However, as shown in FIG. 4B, when looking at a detailed influence, it is seen that reception sensitivity is hardly affected during communication in an capacitance of more than about 30 pF and accordingly, the capacitance of the capacitor layer may use a high capacitance of more than 30 pF in a mobile wireless communication frequency band.

As a result, the electric shock protection device 100 may pass communication signals flowing from the conductor 12 by a high capacitance of an internal capacitor layer without attenuation.

Hereinafter, various embodiments of an electric shock protection device will be described in more detail with reference to FIGS. 5 to 7.

Figure 5C:
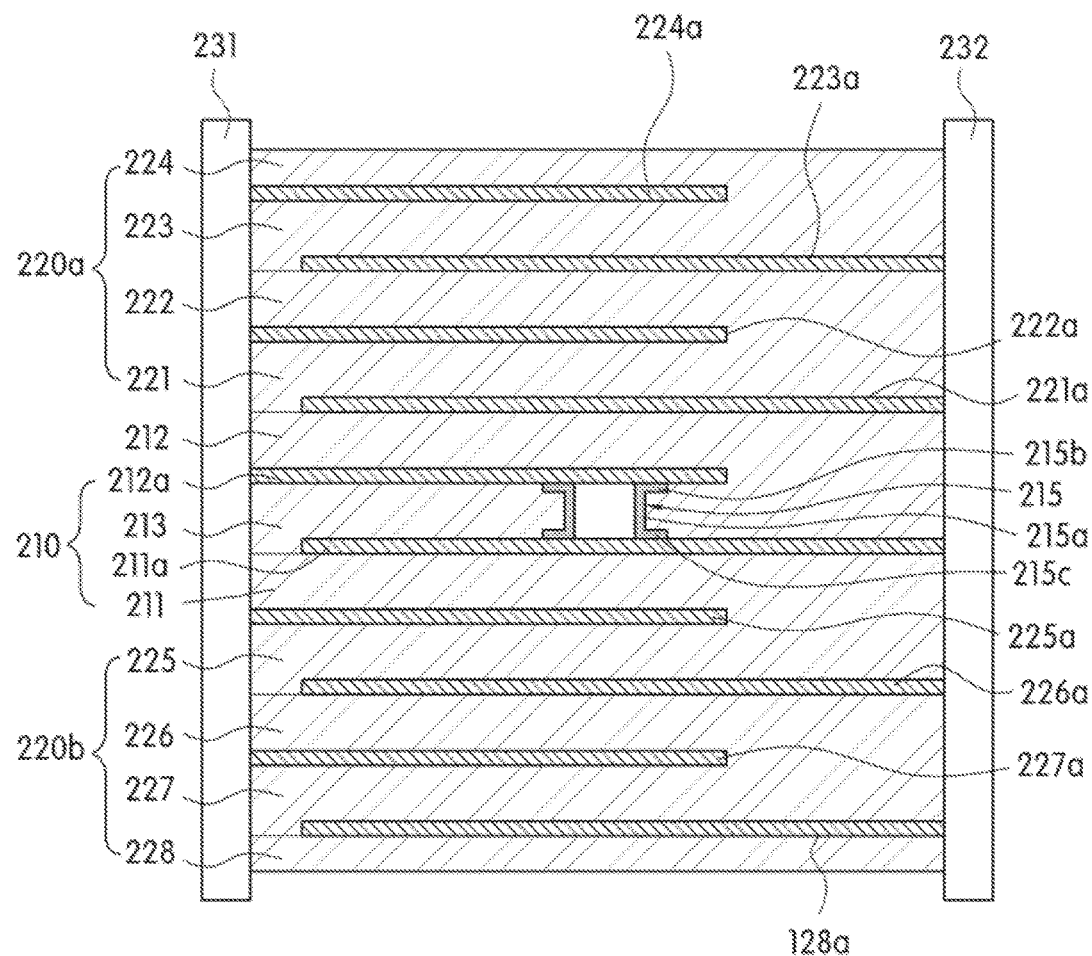

The electric shock protection device 200, as shown in FIGS. 5A to 5C, may be in a suppressor form. The electric shock protection device 200 may include a sintered body, an electric shock protection unit 210, and capacitor layers 220*a* and 220*b*.

At this point, in order to configure the electric shock protection unit 210 and the capacitor layers 120a and 120b, after a plurality of sheet layers 211, 212, 213, 221, 222, 223, 224, 225, 226, 227, and 228 that respectively include electrodes 211a, 212a, 221a, 222a, 223a, 215a, 225a, 226a, 227a, and 228a are sequentially stacked on one surface and the plurality of electrodes respectively disposed on one surfaces of the plurality of sheet layers are disposed to face each other, the sintered body is integrally formed through a firing or hardening process.

Such a sintered body may be formed of an insulator having permittivity. For example, the insulator may be formed of ceramic material, Low Temperature Co-fired Ceramics (LTCC), High Temperature Co-fired Ceramics (HTCC), and magnetic material. At this point, the ceramic material may be a metal-oxide compound and the metal-oxide compound may include at least one of $Er_2O_3$, $Dy_2O_3$, $Ho_2O_3$, $V_2O_5$, $CoO$, $MoO_3$, $SnO_2$, $BaTiO_3$, and $Nd_2O_3$.

The inner electrodes 211a and 212a may be formed spaced a predetermined interval apart from each other in the sintered body and may be formed of at least one pair. Herein, the first inner electrode 211a and the second inner electrode 212a may be electrically connected to external electrodes 231 and 232 provided at both ends of a sintered body.

The inner electrodes 211a and 212a may include at least one of Ag, Au, Pt, Pd, Ni, and Cu and the external electrodes 231 and 232 may include at least one of Ag, Ni, and Sn.

The inner electrodes 211a and 212a may be provided in various forms and patterns and the first inner electrode 211a and the second inner electrode 212a may be provided in the same pattern or may be provided in different patterns. That is, as long as parts of the first inner electrode 211a and the second inner electrode 212a are disposed to overlap facing each other while a sintered body is configured, the inner electrodes 211a and 212a are not limited to a specific pattern.

At this point, an interval between the inner electrodes 211a and 212a, areas facing each other, or an overlapping length may be configured to satisfy the breakdown voltage Vbr of the suppressor 200 and for example, an interval between the inner electrodes 211a and 212a may be 10 μm to 100 μm.

Moreover, a protective sheet layer 213 is disposed between the pair of electrodes 211a and 212a corresponding to each other in order to block static electricity and protect an electric shock protection device and peripheral circuits from overvoltage.

The protective sheet layer 213 includes at least one pore-forming member 215 formed of a hollow type between the pair of inner electrodes 211a and 212a. For this, the protective sheet layer 213 may include a through hole formed at a position at which the pore-forming member 215 is provided.

More specifically, in relation to the sintered body, the first sheet layer 211 including the first inner electrode 211a and the second sheet layer 212 including the second inner electrode 212a are stacked on the top surface and the protective sheet layer 212 is disposed between the first sheet layer 211 and the second sheet layer 213.

That is, the first sheet layer 211, the protective sheet layer 213, and the second sheet layer 212 may be sequentially stacked to allow the first inner electrode 211a and the second inner electrode 212a to face each other.

Accordingly, after the first inner electrode 211a and the second inner electrode 212a are disposed to face each other, they are spaced a predetermined interval apart from each other by the protective sheet layer 213 and the first inner electrode 211a and the second inner electrode 212a are disposed to allow each one side to contact the pore-forming member 215.

Moreover, at least one through hole is formed by penetrating the protective sheet layer 213 disposed between the first sheet layer 211 and the second sheet layer 212.

Herein, the through hole is formed to be disposed in an area where the first inner electrode 211a and the second inner electrode 212a, which are disposed vertically, overlap each other on the basis of the protective sheet layer 213.

At this point, the through hole may include the pore-forming member 215. The pre-forming member 215 is disposed between the inner electrodes 211a and 212a and may include discharging material layers 125a, 125b, and 125c applied to the inner wall with a predetermined thickness along a height direction.

Alternatively, if the pore-forming member 215 is not provided additionally, a discharging material layer may be applied to the inner wall of the through hole at a predetermined thickness along a height direction.

Herein, the pore-forming member 215 or the discharging material layer applied thereto may be provided to allow the upper end to contact the second inner electrode 212a and the lower end to contact the first inner electrode 211a.

A pore 216 may be formed between the pair of inner electrodes 211a and 212a by the pore-forming member 215. A static electricity flowing from the outside may be discharged between the inner electrodes 211a and 212a by the pore 216. At this point, electrical resistance between the inner electrodes 211a and 212a may become lower and a voltage difference between both ends of the electric shock protection device 200 may be reduced to less than a predetermined value. Accordingly, the electric shock protection device 220 may pass static electricity without causing dielectric breakdown.

Herein, a discharging material layer configuring the discharging material layers 225a, 225b, and 225c is required to have low permittivity and no conductivity and there should be no short when overvoltage is applied.

For this, the discharging material layer may be formed of a non-conductive material including at least one of metal particles and may be formed of a semiconductor material including SiC or a silicon based component. Furthermore, the discharging material layer may be formed by mixing at least one of a material selected from SiC, carbon, graphite, and ZnO and at least one of a material selected from Ag, Pd, Pt, Au, Cu, Ni, W, and Mo at a predetermined ratio.

As one example, when the first inner electrode 211a and the second inner electrode 212a include an Ag component, the discharging material layer may include a SiC—ZnO based component. A Silicon carbide (SiC) component has excellent thermal stability, excellent stability in oxidizing atmosphere, a predetermined electrical conductivity and thermal conductivity, and low permittivity.

Then, a ZnO component has excellent non-linear resistance characteristics and discharge characteristics.

When SiC and ZnO are used separately, both have conductivity but when they are mixed and a firing process is performed thereon, ZnO is bonded to a SiC particle surface, thereby forming an insulation layer.

Such an insulation layer forms a SiC—ZnO reaction layer on a SiC particle surface as SiC is completely reacted. Accordingly, the insulation layer further provides a high insulation to a discharging material and improves the resistance to static electricity by blocking Ag pass so that when the suppressor 120 is mounted on an electronic component, DC short phenomenon may be resolved.

Herein, although it is described that a SiC—ZnO based component is included as one example of the discharging material, but the present invention is not limited thereto and the discharging material layer may use a non-conductive material including a semiconductor material or a metal particle, which is appropriate for a component configuring the first inner electrode 211a and the second inner electrode 212a.

At this point, the discharging material layers 215a, 215b, and 215c applied to the inner wall of the pore-forming member 215 may include a first portion 215a applied along the inner wall of the pore-forming member 215, a second portion 215b extending from the upper end of the first portion 215a along the top surface of the protective sheet layer 213 to be in contact to face the first inner electrode 211a, and a third portion 215c extending from the lower end of the first portion 215a along the bottom surface of the protective sheet layer 213 to be in contact to face the second inner electrode 212a.

Through this, since the second portion 215b and the third portion 215c are formed as respectively extending from the upper end and the lower end of the pore-forming member 215 in addition to the inner wall of the pore-forming member 215, the discharging material layers 215a, 215b, and 215c may widen a contact area with the first inner electrode 211a and the second inner electrode 212a.

By such a configuration, as part of a component configuring the discharging material layers 215a, 215b, and 215c is vaporized by electrostatic spark, even if part of the discharging material layers 215a, 215b, and 215c is damaged, the discharging material layers 215a, 215b, and 215c may perform their functions so that the resistance to static electricity can be improved.

On the other hand, the protective sheet layer 213 may include a plurality of pore-forming members 215. In such a way, if the number of pore-forming members 215 is increased, as a discharge path of static electricity is increased, the resistance to static electricity can be improved.

It should be clarified that the protective sheet layer 213 disposed between the first sheet layer 211 and the second sheet layer 212 may be provided to have the same area as the first sheet layer 211 and the second sheet layer 212 but may be provided to have an area where the first inner electrode 211a and the second inner electrode 212a corresponding to each other overlap and have an area that is narrower than the first sheet layer 211 and the second sheet layer 212.

The capacitor layers 220a and 220b are used for passing communication signals flowing from the conductor 12 such as an antenna without attenuation and may be electrically connected in parallel to the electric shock protection unit 210. For example, the capacitor layers 220a and 220b may be disposed on at least one or both of the upper part and the lower part of the electric shock protection unit 210.

Herein, each of the capacitor layers 220a and 220b may include a plurality of stacked sheet layers. At this point, a plurality of sheet layers configuring the capacitor layers 220a and 220b may be formed of an insulator with permittivity and preferably may be formed of a ceramic material.

For example, the ceramic material may be formed of a metal-oxide compound including at least one selected from Er2O3, Dy2O3, Ho2O3, V2O5, CoO, MoO3, SnO2, and BaTiO3 or may be formed of ferrite and LTCC or HTCC may be used. Furthermore, it should be understood that the ceramic material may include a ZnO based varistor material or any one of a Pr and Bi-based material, and Er2O3, Dy2O3, Ho2O3, V2O5, CoO, MoO3, SnO2, and BaTiO3, which are mentioned as a metal-oxide compound, are exemplary, and other types of metal-based oxide compounds not mentioned above may be used.

At this point, a plurality of capacitor electrodes configuring the capacitor layers 220a and 220b may be provided to allow an interval d1 between the pair of capacitor electrodes facing each other to have a range of 15 μm to 100 μm and for example, an interval of 20 μm.

On the other hand, in relation to the electric shock protection device 200, the electric shock protection unit 210 and the capacitor layers 220a and 220b may be configured with different electrode intervals and electrode widths.

That is, an interval between the pair of inner electrodes 211a and 212a disposed to face each other may be identical to an interval between the capacitor electrodes 221a, 222a, 223a, 224a, 225a, 226a, 227a, and 228a.

At this point, an interval between the electric shock protection unit 210 and the capacitor layers 220a and 220b may be greater than an interval between the pair of inner electrodes 211a and 212a.

That is, it is desirable to secure a sufficient interval with the inner electrodes 211a and 212a in order to prevent static electricity or leakage current flowing along the pair of inner electrodes 211a and 212a from leaking toward an adjacent capacitor electrode. At this point, a distance between the capacitor layers 220a and 220b and the electric shock protection unit 210 may be 15 μm to 100 μm and may be two times greater than an interval between the pair of inner electrodes 211a and 212a. For example, when an interval between the pair of inner electrodes 211a and 212a is 10 μm, a distance between the capacitor layers 220a and 220b and the electric shock protection unit 210 may be greater than 20 μm.

In such a way, as including the capacitor layers 220a and 220b, the electric shock protection device 100 may easily provide a capacitance appropriate for the purpose of use in addition to passing static electricity and blocking a leakage current of external power source. That is, unlike a typical method of using an additional component for increasing RF reception sensitivity in addition to a suppressor, a varistor or a Zener diode for protecting an inner circuit from static electricity, by such the capacitor layers 220a and 220b, protection against static electricity may be provided through one electric shock protection device 100 and RF reception sensitivity may be increased.

Figure 6:
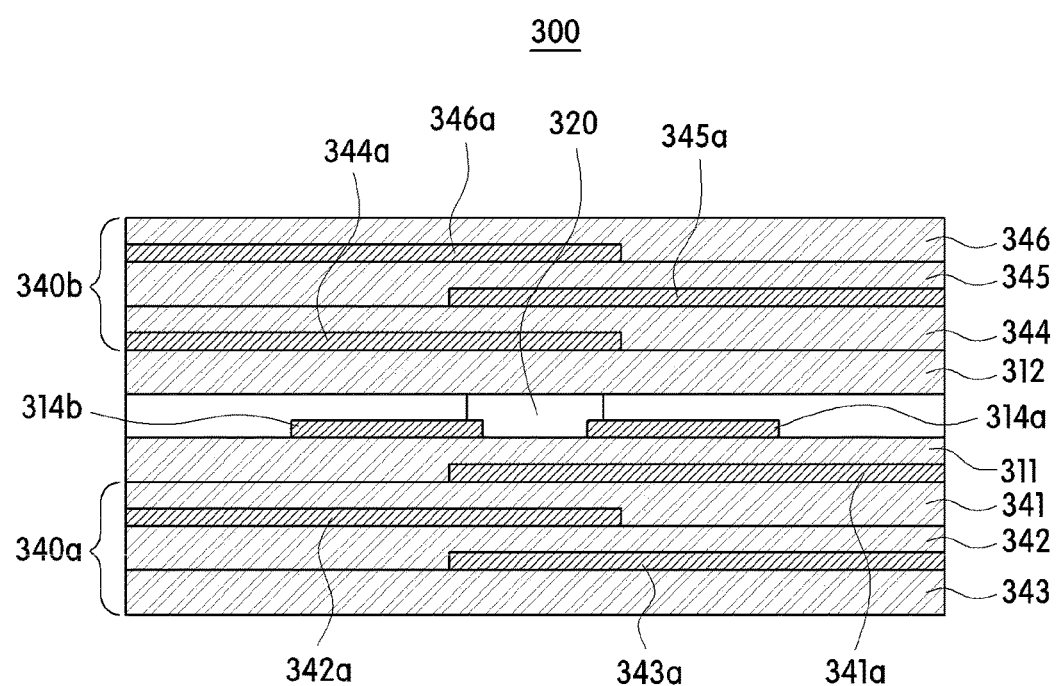
FIG. 6 is a view illustrating an electric shock protection device according to another embodiment of the present invention.

As another embodiment, as shown in FIG. 6, the electric shock protection device 300 may include the pair of inner electrodes 314a and 314b disposed horizontally spaced a predetermined interval apart from each other. That is, inner electrodes 314a and 314b are spaced apart from each other to form a pore inside at least one pair of sheet layers 311 and 312. Preferably, the pair of inner electrodes 314a and 314b are spaced a predetermined interval apart from each other in a parallel direction on the same plane.

Herein, a pore 320 may be formed between the pair of inner electrodes 314a and 314b. Herein, the pore 320 may be formed at a higher height than the pair of inner electrodes 314a and 314b and may be formed with a width that is greater than an interval of the pair of inner electrodes 314a and 314b. In such a way, when the volume of the pore 320 is expanded, even when fine particles occur from the inner electrodes 314a and 314b during discharging, since a space between the inner electrodes 314a and 314b is broad, it may reduce the incidence of defects that can be caused by particles. At this point, the pore is a space where discharging starts by the pair of inner electrodes 314a and 314b when static electricity flows and the volume of the pore may be set to satisfy the resistance to static electricity. For example, the volume of the pore may be 1% to 15% with respect to the total volume of the electric shock protection device 300.

More specifically, the pair of inner electrodes 314a and 314b are arranged spaced apart from each other to form a gap at the upper surface of the first sheet layer 311. Herein, a gap between the pair of inner electrodes 314a and 314b may be 10 µm to 100 µm. Such the pair of inner electrodes 314a and 314b are pattern-printed on the top surface of the first sheet layer 311.

At this point, a pore 320 for blocking static electricity, protecting an electric shock protection device and peripheral circuits from overvoltage, and cutting off leakage current is provided between the pair of electrodes 314a and 314b corresponding to each other in order to.

The pore 320 is disposed between the pair of inner electrodes 314a and 314b arranged in parallel to each other on the same plane and is provided in a hollow form to be filled with air, and the second sheet layer 312 is stacked on the open upper part of the pore 320.

The pore 320 is provided in plurality and may be arranged spaced apart from each other along the width direction of the inner electrodes 314a and 314b. In such a way, if the number of pores 320 is increased, as a discharge path of static electricity is increased, the resistance to static electricity can be improved.

At this point, the pore 320 is formed to have a height that exceeds the height from the top surface of the first sheet layer 311 to the upper end of the inner electrodes 314a and 314b. That is, the pore 320 according to an embodiment of the present invention is provided to have a height that exceeds the entire height of the inner electrodes 314a and 314b so that the volume of the entire pore 320 may be enlarged.

Through this, when fine particles occur from the inner electrodes 314a and 314b during discharging of static electricity, it may reduce the incidence of defects that can be caused by particles through the pore 320 having a broad space.

At this point, the pore 320 may be provided to extend toward the top surface or the bottom surface of the pair of inner electrodes 314a and 314b spaced apart from each other.

Furthermore, the pore 320 may be provided with the same width as the pair of inner electrodes 314a and 314b and at this point, the pore 320 may be provided to thicker than the thickness of the pair of inner electrodes 314a and 314b.

After a pore material is pattern-printed between the pair of inner electrodes 314a and 314b, as the pore material is removed by a heat applied during a firing process, the pore 320 is formed. Herein, the pore material is used to prevent the pore 320 from being deformed or damaged by pressure during a compression process for forming a sintered body after a first sheet layer 311 and a second sheet layer 312 are stacked.

For this, as the pore material is formed of a material that is decomposed by a high temperature heat, it may be removed during a firing process after a plurality of sheet layers are stacked. As one example, the pore material may be formed of a material decompressed in a temperature range of 200° C. to 2000° C.

For example, the pair of inner electrodes 314a and 114b disposed facing each other may be provided in polygonal form, circular form, elliptical form, spiral form, and various forms and patterns obtained by combining them. Then, inner electrodes facing each other may be provided in the same pattern and form or may be provided in different patterns and forms.

On the other hand, in relation to the pair of inner electrodes 314a and 314b, gaps spaced a predetermined interval apart from each other are formed between end parts facing each other and the pore 320 is provided around the center of the gap. At this point, a discharging material layer applied at a predetermined thickness according to a height direction of the inner electrodes 314a and 314b is provided to the inner wall of the pore 320. At this point, it should be clarified that the discharging material layer may be provided at only the inner wall of the pore 320 but may be applied to cover an open upper part of the pore 320. That is, the discharging material layer may extend by connecting the open upper ends of the pore 320 in addition to the inner wall of the pore 320.

On the other hand, in relation to the first sheet layer 311 and the second sheet layer 312 configuring the sintered body, the second sheet layer 311 may be directly stacked on the first sheet layer 312 but an additional buffer layer corresponding to the height of the pair of inner electrodes 314a and 314b formed at the top surface of the first sheet layer 311 and the pore 320 may be stacked. Such a buffer layer may perform a role for removing a height difference corresponding to the height of the inner electrodes 314a and 314b and the height of the pore 320.

Figure 7A:
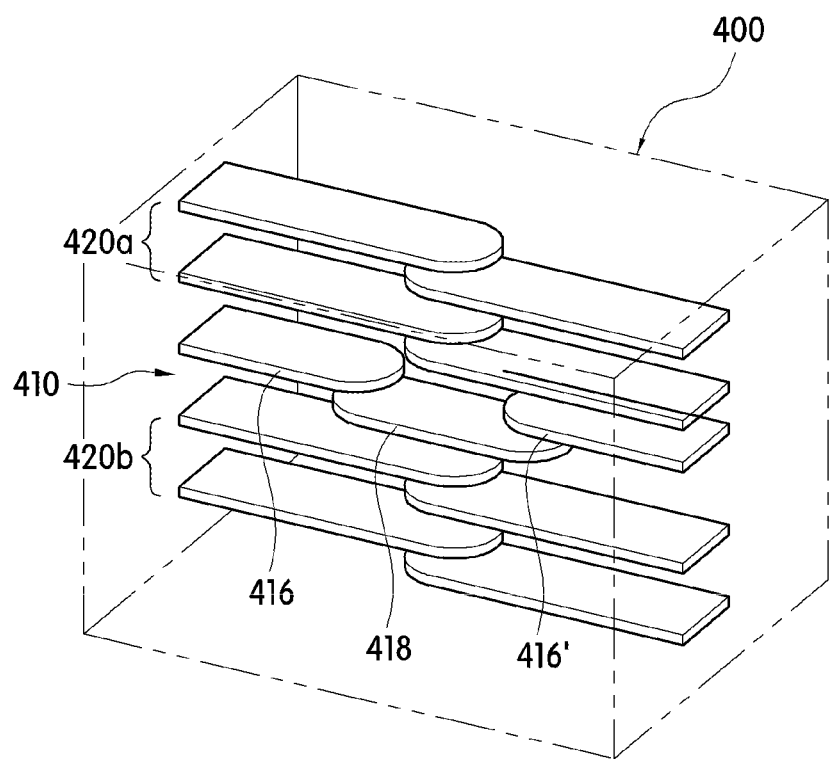
FIGS. 7A to 7C are views illustrating an electric shock protection device according to another embodiment of the present invention.
Figure 7B:
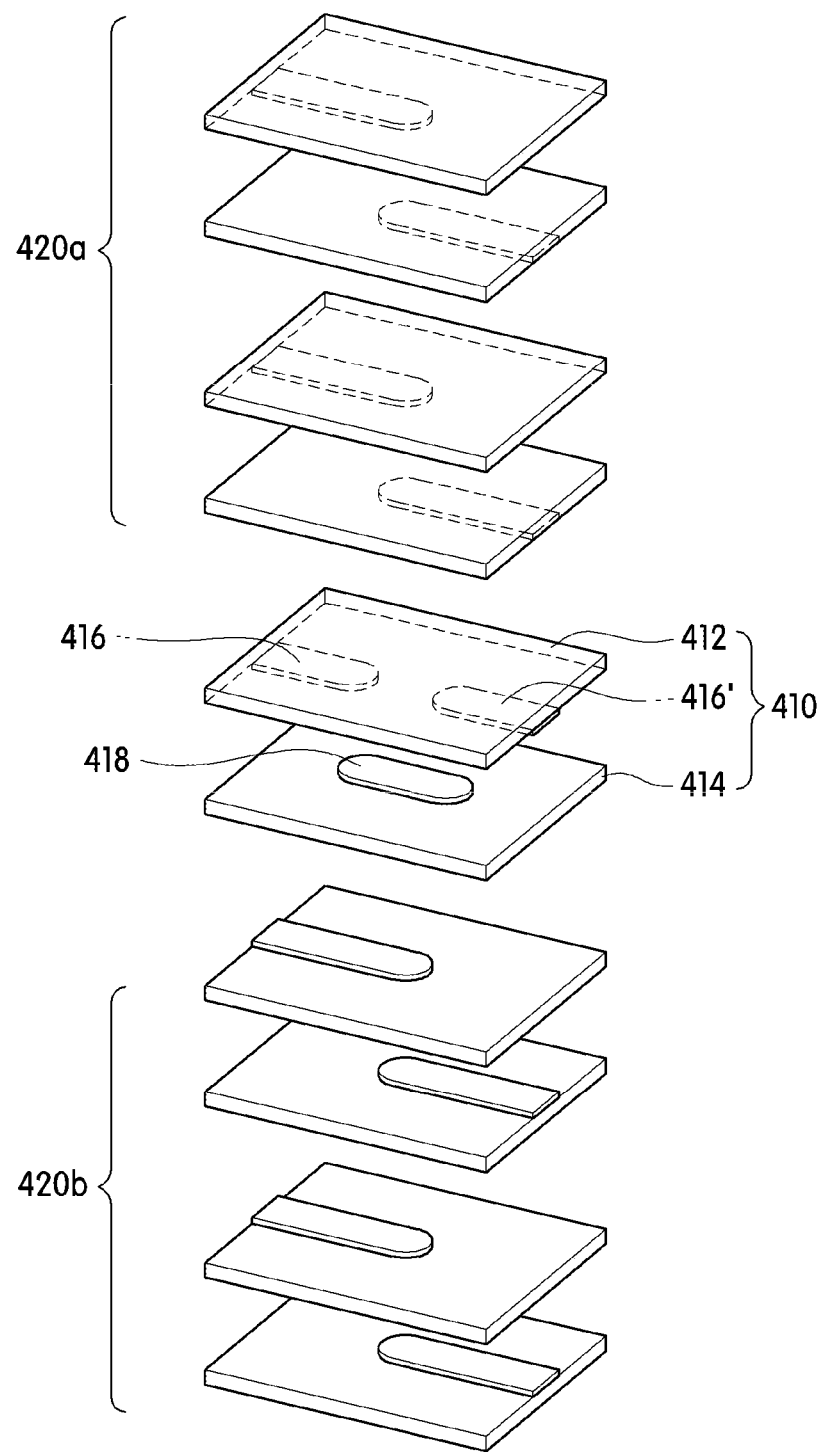
Figure 7C:
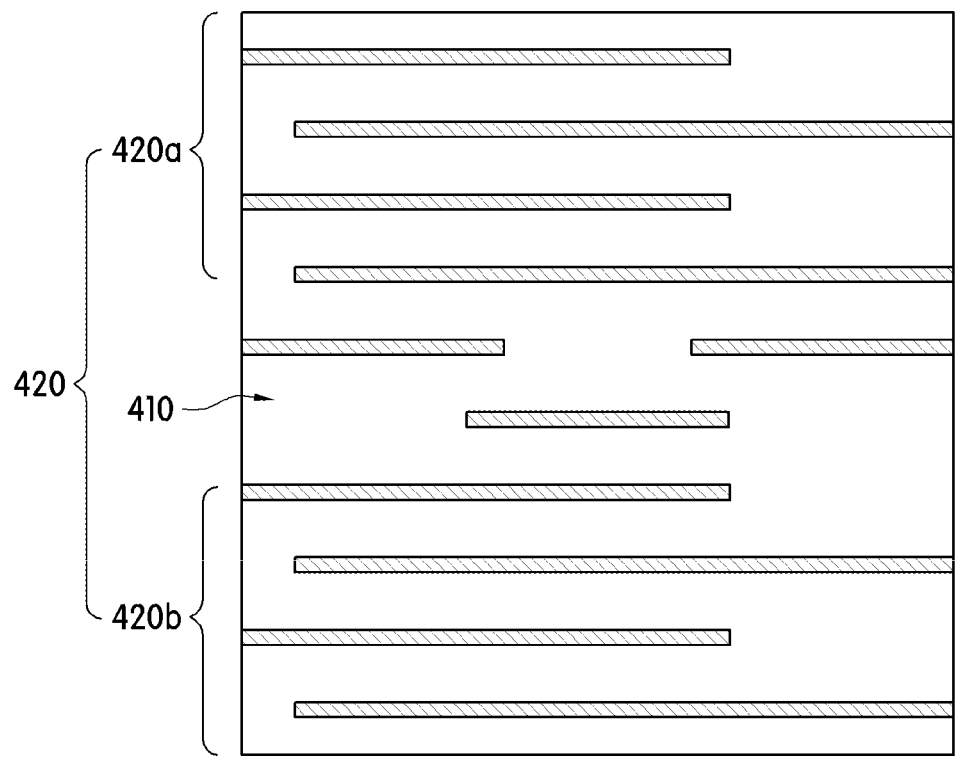

The electric shock protection device, as shown in FIGS. 7A to 7C, may be in an electric shock protection device 400. The electric shock protection device 400 may include an electric shock protection unit 410 and capacitor layers 420a and 420b.

The electric shock protection unit 410 includes varistor material layers 412 and 414 and a plurality of inner electrodes 416, 416', and 418.

At this point, the varistor material layer may be formed of at least two layers including a first varistor material layer 412 and a second varistor material layer 414, which are alternately stacked. Herein, the first varistor material layer 412 and the second varistor material layer 414 may be formed of a semiconductor material including at least one of $ZnO$, $SrTiO_3$, $BaTiO_3$, and $SiC$ or any one of a Pr and Bi based material. Additionally, the varistor material layer may be set to allow the particle size of a varistor material to satisfy the breakdown voltage Vbr.

The inner electrode may include a plurality of first inner electrodes 416 and 416' spaced a predetermined interval L apart from each other on the first varistor material layer 412 and a plurality of second inner electrodes 418 spaced a predetermined interval L apart from each other on the second varistor material layer 414.

Herein, the breakdown voltage Vbr of the varistor 400 may be the sum of each unit breakdown voltage formed between the most adjacent first inner electrodes 416 and 416' and second inner electrode 418. Herein, the breakdown voltage Vbr of the varistor 400 may be the sum of each unit breakdown voltage formed between the most adjacent first inner electrodes 416 and 416' and second inner electrode 418.

The first inner electrodes 416 and 416' and the second inner electrode 418 each may be disposed not to overlap at least a portion thereof. That is, the first inner electrodes 416 and 416' and the second inner electrode 418 each may be alternately disposed to allow at least a portion thereof to overlap each other or may be alternately disposed therebetween not to overlap each other.

At this point, the first inner electrodes 416 and 416' or the second inner electrode 418 may be set to have an interval so that static electricity or leakage current does not leak to an external electrode (not shown) adjacent to the inner electrodes 416, 416', and 418 and progresses normally between the inner electrodes 416, 416', and 418.

For example, a spaced interval L between one first inner electrode 416 and the adjacent first inner electrode 416' may be formed greater than the sum of the shortest interval L between the first inner electrode 416 and the second inner electrode 418 and the shortest distance d2 between the adjacent other inner electrode 416' and the second inner electrodes 418.

In addition, a distance between the second inner electrode 418 and an adjacent external electrode (not shown) may be formed greater than a spaced interval between the first inner electrodes 416 or 416'.

More specifically, the first varistor material layer 412 may include the two first inner electrodes 416 and 416' and the two first inner electrodes 416 and 416' may be spaced apart from each other in parallel on the same plane.

Then, the second varistor material layer 414 may include the second inner electrode 418 on one surface.

At this point, the first varistor material layer 412 and the second varistor material layer 414 are stacked vertically in order to allow the second inner electrode 418 to be spaced a predetermined interval apart from the two first inner electrodes 416 and 416' vertically.

Furthermore, the second inner electrode 418 may be disposed to allow the both end parts to overlap one end part of the two first inner electrodes 416 and 416'. For this, the center part of the second inner electrode 418 may be disposed to be located at the center part of a gap L1 formed between the two first inner electrodes 416 and 416'.

Figure 8A:
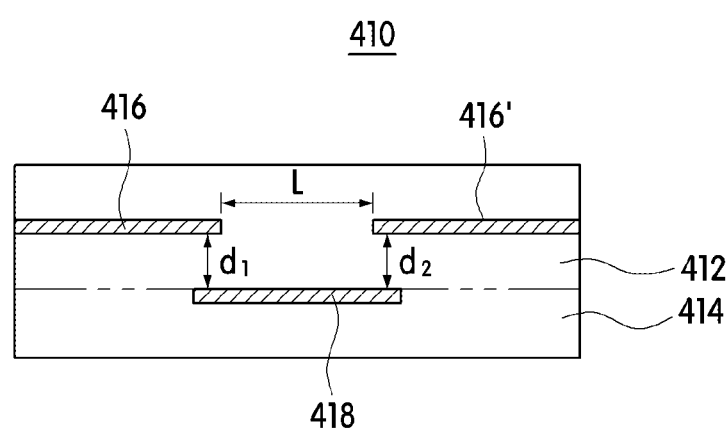
FIGS. 8A and 8B are views illustrating various arrangement of a electric shock protection unit in an electric shock protection device according to another embodiment of the present invention.

Herein, the first varistor material layer 412 where the two first inner electrodes 416 and 416' are formed, as shown in FIG. 8A, may be stacked at the upper part of the second varistor material layer 414 where one second inner electrode 418 is formed or may be stacked at the lower part of the second varistor material layer 414, selectively.

Figure 8B:
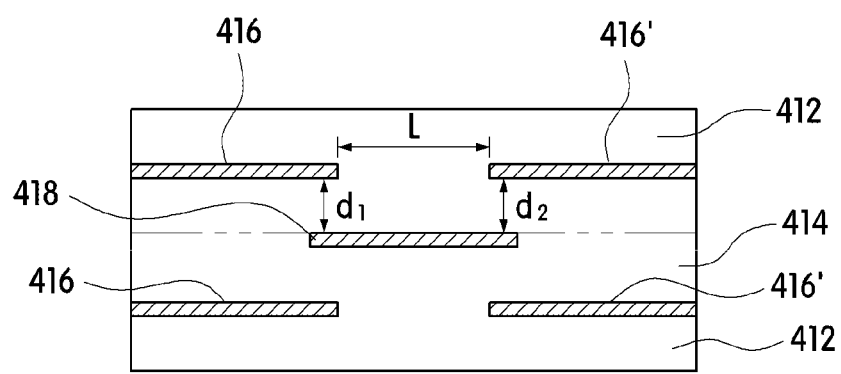

As shown in FIG. 8B, in relation to the electric shock protection unit 410, a plurality of unit devices formed by the two first inner electrodes 416 and 416' and the second inner electrode 418 may be provided in parallel. That is, the electric shock protection unit 410 may have a form in which the two first varistor material layers 412 where the two first inner electrodes 416 and 416' and one second varistor material layer 414 where one second inner electrode 418 are stacked alternately.

At this point, the two first varistor material layers 412 may be staked in a form of being disposed on each of the top and bottom of the second varistor material layer 414. Herein, the second inner electrode 418 formed at the second varistor material layer 414 may be disposed to allow the both end parts to overlap one end parts of the first inner electrodes 416 and 416' disposed a the top and the second inner electrode 418 disposed at the bottom.

Then, the first inner electrodes 416 and 416' disposed at the top of the second varistor material layer 414 and the first inner electrodes 416 and 416' disposed at the bottom of the second varistor material layer 414 may be disposed in parallel vertically and the second inner electrode 418 may be disposed between the first inner electrodes 416 and 416' spaced apart from each other vertically.

At this point, the center part of the second inner electrode 418 may be disposed to be located at the center part of an interval L between the two first inner electrodes 416 and 416'.

The first varistor material layer 412 and the second varistor material layer 414 may be disposed in various stacked orders while satisfying the above-mentioned intervals d1 and d2 or interval L therebetween of the two first inner electrodes 416 and 416' and the second inner electrode 418.

For example, the two second varistor material layers 414 may be staked in a form of being disposed on each of the top and bottom of the first varistor material layer 412.

Herein, the second inner electrode 418 formed at the second varistor material layer 414 may be disposed at a position where the both end parts overlap the pair of the first inner electrodes 416 and 416' spaced apart from each other at the top and bottom.

At this point, the second inner electrodes 418 may be set to have an interval so that static electricity or leakage current does not leak to an external electrode (not shown) and progresses normally to the first inner electrodes 416 and 416'. For example, a distance between the second inner electrode 418 and an adjacent external electrode (not shown) may be formed greater than the intervals d1 and d2 between the first inner electrodes 416 or 416'.

In such a way, as the first varistor material layer 412 and the second varistor material layer 414 are multiple-stacked, a discharge path of static electricity is increased, so that the resistance to static electricity can be improved.

On the other hand, according to each unit breakdown voltage formed between the first inner electrodes 416 and 416' and the second inner electrode 418. The number thereof for satisfying the breakdown voltage Vbr of the varistor 400 may be determined That is, although it is described that a unit device formed by the first inner electrodes 416 and 416' and the second inner electrode 418 is two, the present invention is not limited thereto and the unit device may be formed in plurality according to the size of a unit breakdown voltage.

In such a way, as the first varistor material layer 412 and the second varistor material layer 414 are multiple-stacked, a discharge path of static electricity is increased, so that the resistance to static electricity can be improved.

Since the two first inner electrodes 416 and 416' and the second inner electrode 418 are provided at a varistor material layer, while static electricity is applied, due to non-linear voltage characteristics of a varistor material, an electrical resistance between the two first inner electrodes 416 and 416' and the second inner electrode 418 becomes lower so that the varistors 400 and 400' may pass static electricity. Accordingly, a varistor material may pass static electricity without causing dielectric breakdown by an instantaneous high static electricity.

The capacitor layers 420a and 420b are used for passing communication signals flowing from the conductor 12 such as an antenna without attenuation and may be electrically connected in parallel to the electric shock protection unit 410. For example, the capacitor layers 420a and 420b may be disposed on at least one or both of the upper part and the lower part of the electric shock protection unit 410.

Herein, each of the capacitor layers 420a and 420b may include a plurality of stacked sheet layers. At this point, a plurality of sheet layers configuring the capacitor layers 420a and 420b may be formed of an insulator with permittivity and preferably may be formed of a ceramic material.

For example, the ceramic material may be formed of a metal-oxide compound including at least one selected from Er2O3, Dy2O3, Ho2O3, V2O5, CoO, MoO3, SnO2, and BaTiO3 or may be formed of ferrite and LTCC or HTCC may be used. Furthermore, it should be understood that the ceramic material may include a ZnO based varistor material or any one of a Pr and Bi-based material, and Er2O3, Dy2O3, Ho2O3, V2O5, CoO, MoO3, SnO2, and BaTiO3, which are mentioned as a metal-oxide compound, are exemplary, and other types of metal-based oxide compounds not mentioned above may be used.

At this point, a plurality of capacitor electrodes configuring the capacitor layers 420a and 420b may be provided to allow an interval between the pair of capacitor electrodes facing each other to have a range of 15 μm to 100 μm and for example, an interval of 20 μm.

Additionally, a distance between the capacitor layers 420a and 420b and the electric shock protection unit 410 may be greater than the sum of the shortest distance between the first inner electrode 146 and the second inner electrode 418 and the shortest distance between the other first inner electrode 416' and the second inner electrode 418.

That is, it is desirable to secure a sufficient interval with the inner electrodes 416, 416', and 418 in order to prevent static electricity or leakage current flowing along the first inner electrodes 416 and 416' or the second inner electrode 418. At this point, a distance between the capacitor layers 420a and 420b and the electric shock protection unit 410 may be 15 μm to 100 μm and may be two times greater than an interval between the first inner electrodes 416 and 416' and the second inner electrode 418. For example, when a distance between the first inner electrodes 416 and 416' and the second inner electrode 418 is 10 μm, a distance between the capacitor layers 420a and 420b and the electric shock protection unit 410 may be greater than 20 μm.

In such a way, as including the capacitor layers 420a and 420b, the electric shock protection device 100 may easily provide a capacitance appropriate for the purpose of use in addition to passing static electricity and blocking a leakage current of external power source. That is, unlike a typical method of using an additional component for increasing RF reception sensitivity in addition to a suppressor, a varistor or a Zener diode for protecting an internal circuit from static electricity, by such the capacitor layers 420a and 420b, protection against static electricity may be provided through one device and RF reception sensitivity may be increased.

In relation to an electric shock protection device and a portable electronic device including the same according to an embodiment of the present invention, with an electric shock protection device connecting a conductor and a circuit unit in a portable electronic device where the conductor such as a metal case is exposed to the outside, a user and an internal circuit are protected from leakage current and static electricity by external power source and a high capacitance is implemented so that communication signals are delivered with minimal attenuation.

The above-disclosed subject matter is to be considered illustrative, and not restrictive, and the appended claims are intended to cover all such modifications, enhancements, and other embodiments, which fall within the true spirit and scope of the present invention. Thus, to the maximum extent allowed by law, the scope of the present invention is to be determined by the broadest permissible interpretation of the following claims and their equivalents, and shall not be restricted or limited by the foregoing detailed description.

What is claimed is:

1. An electric shock protection device for connecting between a metal case of an electronic device which is a human body contactable conductor and comprising a part used as an antenna, and an internal circuit of the electronic device comprising:

an electric shock protection unit passing static electricity by electrically conducting the static electricity when the static electricity is flowing from the metal case, and blocking a leakage current of an external power source by being maintained in an open state without being electrically conducting when the leakage current of the external power source is flowing from a ground of the internal circuit so that the leakage current of the external power source is not delivered to the metal case;

a capacitor comprising at least one capacitor layer, the capacitor connected in parallel to both ends of the electric shock protection unit and passing communication signals flowing from the metal case used as the antenna, and blocking a DC component in the leakage current; and a pair of external electrodes respectively connecting to both ends of the electric shock protection unit and the capacitor, wherein the one of the pair of external electrodes is connected to the metal case and the other one of the pair of external electrodes is connected to the internal circuit, wherein the electric shock protection unit comprises:

a sintered body where a plurality of sheet layers are stacked;

at least one pair of inner electrodes spaced a predetermined interval apart from each other inside the sintered body; and a pore disposed between the inner electrodes that has an inner wall to which a discharging material layer is applied at a predetermined thickness along a height direction; and wherein, the discharging material comprises a first portion applied along the inner wall of the pore, a second portion outwardly extending from an upper end of the first portion, and a third portion outwardly extending from a lower end of the first portion; and the second portion contacts one of the pair of inner electrodes and the third portion contacts the other one of the pair of inner electrodes.

2. The electric shock protection device of claim 1, wherein the electric shock protection unit satisfies the following equation:

$$Vbr > Vin$$

where Vbr is a breakdown voltage of the electric shock protection unit, and Vin is a rated voltage of an external power source of the electronic device, and wherein the rated voltage is a country-specific standard rated voltage.

3. The electric shock protection device of claim 1, wherein the electric shock protection unit and the capacitor satisfy the following equation:

$$Vcp > Vbr$$

where Vbr is a breakdown voltage of the electric shock protection unit and Vcp is a dielectric breakdown voltage of the capacitor.

4. The electric shock protection device of claim 1, wherein the communication signals have a wireless communication frequency band.

5. The electric shock protection device of claim 1, wherein the pair of inner electrodes are disposed on the same plane.

6. The electric shock protection device of claim 1, wherein the sintered body is formed of an insulator having permittivity.

7. The electric shock protection device of claim 1, wherein the inner electrode comprises at least one component of Ag, Au, Pt, Pd, Ni, and Cu.

8. The electric shock protection device of claim 1, wherein the discharging material layer is formed of a non-conductive material including metal particles or a semiconductor material.

9. The electric shock protection device of claim 1, wherein an interval between the capacitor and the electric shock protection unit is greater than an interval between the pair of inner electrodes of the electric shock protection unit.

10. The electric shock protection device of claim 1, wherein the electric shock protection unit comprises at least two varistor material layers where a first varistor material layer and a second varistor material layer are stacked alternately, a plurality of first inner electrodes spaced a predetermined interval apart from each other on the first varistor material layer, and a plurality of second inner electrodes spaced a predetermined interval apart from each other on the second varistor material layer.

11. The electric shock protection device of claim 10, wherein the breakdown voltage of the electric shock protection unit is a sum of each unit breakdown voltage formed between the most adjacent first inner electrode and second inner electrode.

12. The electric shock protection device of claim 10, wherein at least portion of each of the first inner electrode and the second inner electrode is disposed to overlap each other.

13. The electric shock protection device of claim 10, wherein each of the first inner electrode and the second inner electrode is disposed not to overlap each other.

14. The electric shock protection device of claim 10, wherein a spaced interval between the first inner electrodes or the second inner electrodes is greater than a sum of the shortest distance between the first inner electrode and the second inner electrode and the shortest distance between the other adjacent first inner electrode and the second inner electrode.

15. The electric shock protection device of claim 10, wherein the first varistor material layer and the second varistor material layer are formed of a semiconductor material including at least one of ZnO, $SrTiO_3$, $BaTiO_3$, and SiC or any one of a Pr and Bi based material.

16. The electric shock protection device of claim 10, wherein a distance between the capacitor and the electric shock protection unit is greater than a sum of the shortest distance between the first inner electrode and the second inner electrode and the shortest distance between the other adjacent first inner electrode and the second inner electrode.

17. The electric shock protection device of claim 10, wherein the capacitor layer comprises a plurality of sheet layers and is formed a ceramic material.

18. The electric shock protection device of claim 1, wherein the electric shock protection unit and the capacitor satisfy the following equation:

$$Vbr > Vin \text{ and } Vcp > Vbr$$

where Vbr is a breakdown voltage of the electric shock protection unit and Vin is a rated voltage of an external power source of the electronic device and Vcp is a dielectric breakdown voltage of the capacitor.

19. The electric shock protection device of claim 1, wherein the capacitor is connected across the electric shock protection unit.

20. A portable electronic device with an electric shock protection function, the portable electronic device comprising:
    a metal case which is a human body contactable conductor and comprising a part used as an antenna;
    a circuit; and
    an electric shock protection device for connecting between the metal case and the circuit,
    wherein
    the electric shock protection device comprises:
    an electric shock protection unit passing static electricity by electrically conducting the static electricity when the static electricity is flowing from the metal case, and blocking a leakage current of an external power source by being maintained in an open state without being electrically conducting when the leakage current of the external power source is flowing from a ground of the circuit so that the leakage current of the external power source is not delivered to the metal case;
    a capacitor connected to both ends of the electric shock protection unit and passing communication signals flowing from the metal case used as the antenna, and blocking a DC component in the leakage current; and
    a pair of external electrodes respectively connecting to both ends of the electric shock protection unit and the capacitor, wherein the one of the pair of external electrodes is connected to the metal case and the other one of the pair of external electrodes is connected to the circuit;
    wherein the conductor comprises at least one of an antenna for communication between the electronic device and an external device, a metal case, and a conductive jewelry; and
    wherein the metal case is provided to surround a camera that is provided at a front or rear surface of a housing of the electronic device to be exposed to the outside.

21. The portable electronic device of claim 20, wherein the metal case is provided to partially or entirely surround a side part of a housing of the electronic device.

22. An electric shock protection device for connecting between a metal case of an electronic device which is a human body contactable conductor and comprising a part used as an antenna, and an internal circuit of the electronic device, the electric shock protection device comprising:
    an electric shock protection unit passing static electricity by electrically conducting the static electricity when the static electricity is flowing from the metal case and also blocking a leakage current of an external power source by being maintained in an open state without being electrically conducting when the leakage current of the external power source is flowing from a ground of the internal circuit so that the leakage current of the external power source is not delivered to the metal case;
    a capacitor connected in parallel to the electric shock protection unit to pass communication signal flowing from the metal case used as the antenna without attenuation, and blocking a DC component in the leakage current; and
    a pair of external electrodes respectively connecting to both ends of the electric shock protection unit and the capacitor,
    wherein the one of the pair of external electrodes is connected to the metal case and the other one of the pair of external electrodes is connected to the internal circuit, and the capacitor comprises at least one capacitor layer, and the capacitor layer comprises a plurality of sheet layers and a plurality of capacitor electrodes, and a plurality of sheet layers are formed a ceramic material, and an interval between the capacitor and the electric shock protection unit is greater than an interval between the inner electrodes of the electric shock protection unit and an interval between the capacitor electrodes, wherein the electric shock protection unit comprises:

a sintered body where a plurality of sheet layers are stacked; and at least one pair of inner electrodes spaced a predetermined interval apart from each other in the sintered body, and wherein the capacitor comprises at least one capacitor layer disposed at one of a top and bottom of the electric shock protection unit or disposed at both the top and bottom of the electric shock protection unit, being spaced a predetermined interval apart from each other.

23. The electric shock protection device of claim 22, wherein the electric shock protection unit comprises at least two varistor material layers where a first varistor material layer and a second varistor material layer are stacked alternately, a plurality of first inner electrodes spaced a predetermined interval apart from each other on the first varistor material layer, and a plurality of second inner electrodes spaced a predetermined interval apart from each other on the second varistor material layer.

* * * * *